United States Patent

Kokubun et al.

[11] Patent Number: 5,898,305
[45] Date of Patent: *Apr. 27, 1999

[54] MAGNETIC RESONANCE IMAGING APPARATUS HAVING A FLUOROSCOPY MODE

[75] Inventors: Katsutoshi Kokubun, Utsunomiya; Takeshiro Suzuki, Otawara; Masaaki Yui, Tochigi-ken, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/844,304

[22] Filed: Apr. 18, 1997

Related U.S. Application Data

[63] Continuation of application No. 08/643,883, May 7, 1996, abandoned, which is a continuation of application No. 08/345,588, Nov. 28, 1994, abandoned.

[30] Foreign Application Priority Data

Nov. 26, 1993 [JP] Japan ................... 5-297078

[51] Int. Cl.$^6$ ....................................... G01V 3/00
[52] U.S. Cl. ............................ 324/318; 324/307
[58] Field of Search .................... 324/300, 307, 324/309, 318, 322; 600/410

[56] References Cited

U.S. PATENT DOCUMENTS 4,739,766  4/1988  Riederer ................... 324/309
4,830,012  5/1989  Riederer ................... 600/410
4,914,727  4/1990  Sano et al. ................ 324/309
4,947,315  8/1990  Sokolow et al. ........... 364/200
5,184,074  2/1993  Kaufman et al. .......... 324/309
5,218,532  6/1993  Mori ......................... 324/309
5,239,266  8/1993  Kaufman et al. .......... 324/309
5,251,635  10/1993 Dumoulin et al. ........ 600/417
5,268,640  12/1993 Du et al. ................... 324/309
5,275,164  1/1994  Maeda et al. ............. 324/309
5,339,034  8/1994  Hennig .................... 324/309
5,406,947  4/1995  Kimura .................... 324/309
5,427,101  6/1995  Sachs et al. .............. 324/309
5,519,320  5/1996  Kanayama et al. ...... 324/309

Primary Examiner—Louis Arana
Attorney, Agent, or Firm—Limbach & Limbach LLP

[57] ABSTRACT

A magnetic resonance imaging apparatus comprises a collecting section that collects from the subject the magnetic resonance signals corresponding to N phase encode data items for restructuring each of a plurality of images, a restructuring section that restructures each set of N phase encode data items corresponding to the magnetic resonance signals obtained by the collecting section, an image processing section that processes the restructured images obtained at the restructuring section, an image output section that outputs the processed images obtained at the image processing section, and a changing section that changes the number of phase encode data items updated among the N phase encode data items restructured at the restructuring section, while the collecting section is in operation.

19 Claims, 9 Drawing Sheets

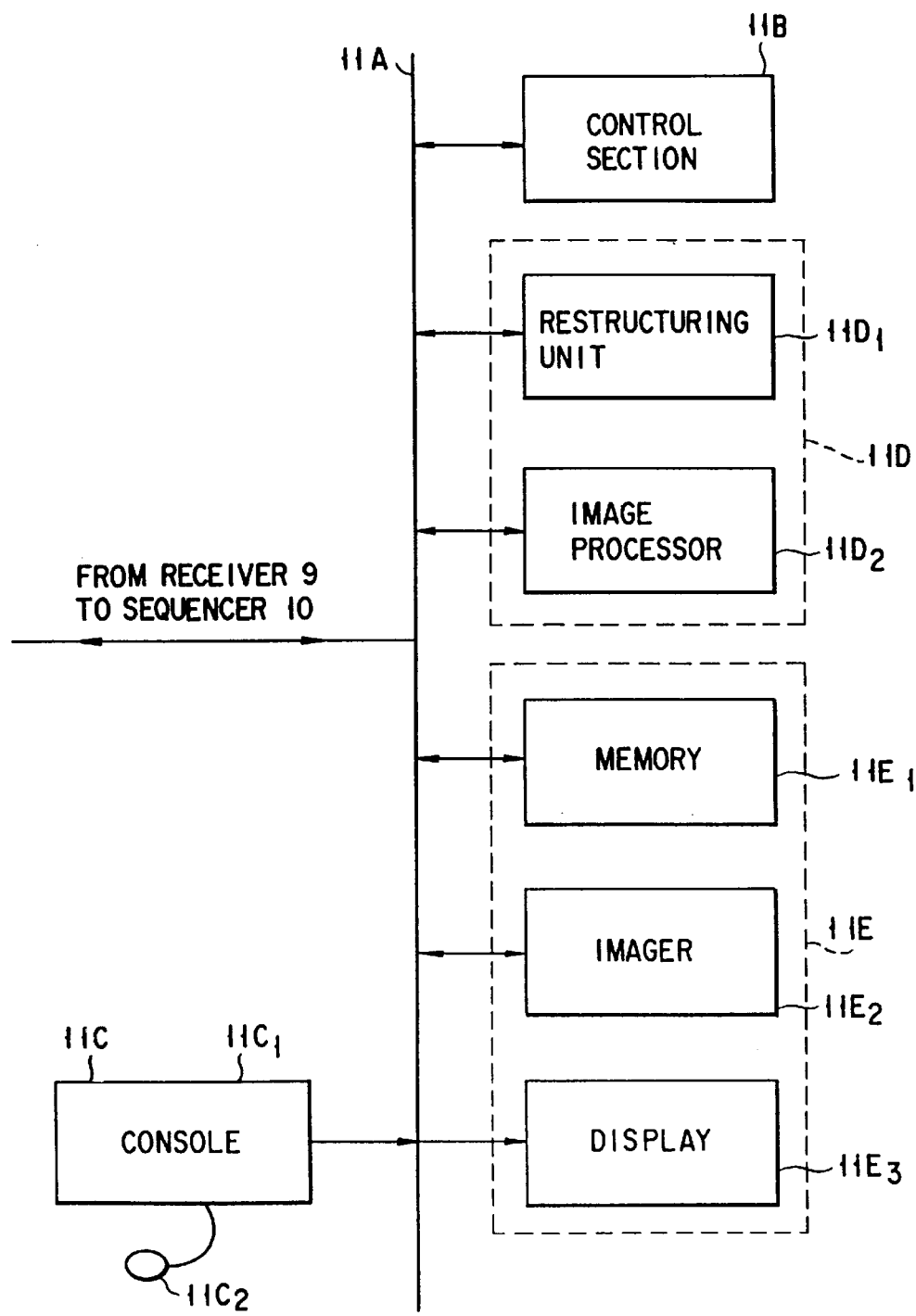
F I G. 2

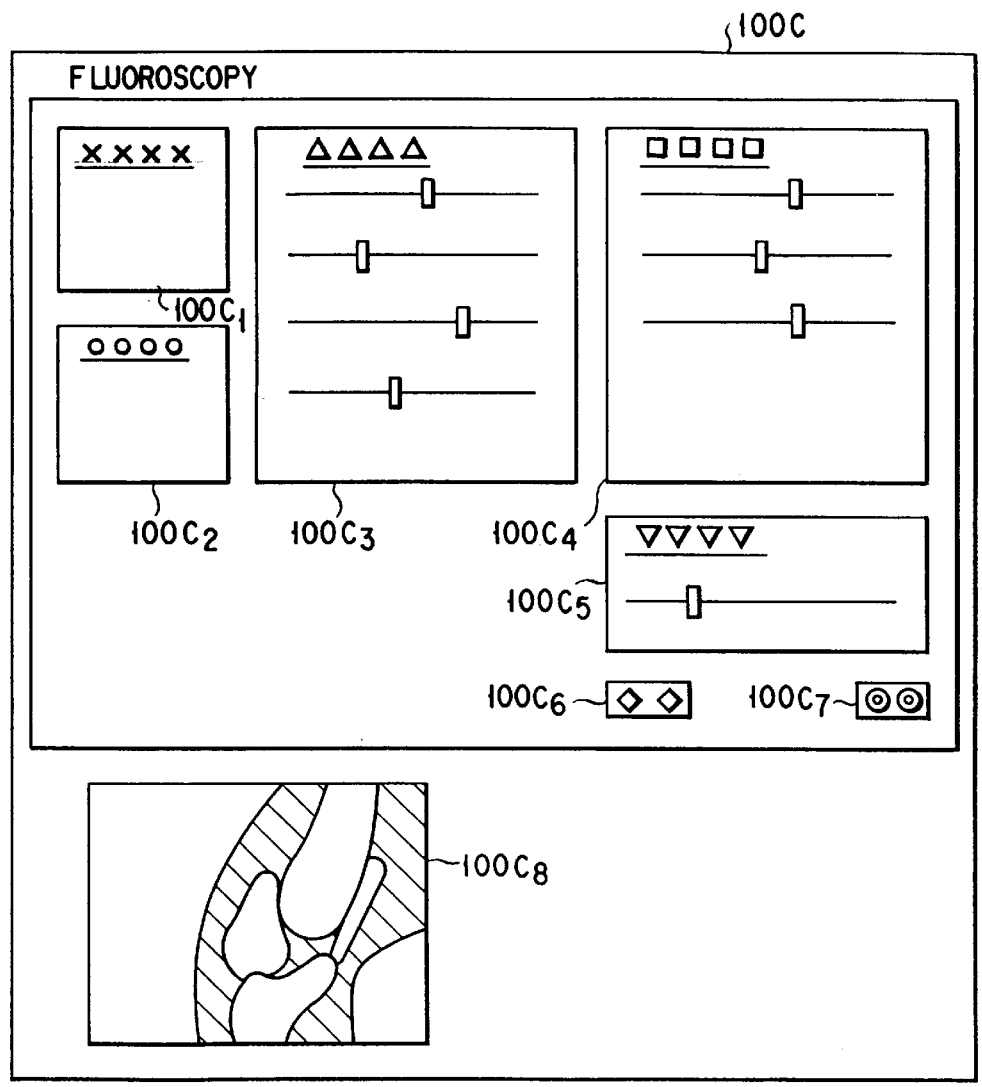
F I G. 7

MAGNETIC RESONANCE IMAGING APPARATUS HAVING A FLUOROSCOPY MODE

This is a continuation of application Ser. No. 08/643,883, filed on May 7, 1996, now abandoned, which is a continuation of application Ser. No. 08/345,588, filed on Nov. 28, 1994, now abandoned.

BACKGROUND OF THE INVENTION

1. Field of the Invention

This invention relates to a magnetic resonance imaging apparatus which obtains figure information such as a tomography of the subject, and functional information such as spectroscopic information, making use of a magnetic resonance (MR) phenomenon.

2. Description of the Related Art

A magnetic resonance phenomenon is such that an atomic nucleus with some spin and magnetic moment placed in a static magnetic field resonantly absorbs and radiates only electromagnetic waves of a specific frequency. The nucleus resonates at an angular frequency of $\omega_o$ expressed by the following equation ($\omega_o=2\pi\gamma_o$, $\gamma_o$=Larmor frequency):

$$\gamma_o = \gamma H_o$$

where $\gamma$ is the gyromagnetic ratio peculiar to the type of atomic nucleus, and $H_o$ is the intensity of the static magnetic field.

An apparatus based on the above-mentioned principles processes induced electromagnetic waves of the same frequency as that of the absorbed electromagnetic waves after the aforementioned resonant absorption, and thereby obtains diagnostic information reflecting MR parameters (including atomic nucleus density, longitudinal relaxation time T1, transverse relaxation time T2, flow, and chemical shift), such as sliced images of the subject, with no invasion.

The acquisition of diagnostic information by magnetic resonance is achieved by exciting all parts of the subject placed in a static magnetic field and collecting the signals. Because of restrictions on apparatus configuration and clinical request for images, actual apparatuses excite a specific part of the subject and collect the signals.

In this case, a specific part to be imaged is generally a sliced part having a particular thickness. Magnetic resonance signals (MR signals), including echo signals and FID signals from the sliced part, are collected by encoding data many times. By restructuring these groups of data items by, for example, a two-dimensional Fourier transformation method, laminograms (sliced images) of the specific sliced part are created.

Such a magnetic resonance imaging apparatus is installed in the clinical field as a sophisticated medical diagnostic instrument which, almost only by electrical operations, provides various pieces of diagnostic information reflecting parameters peculiar to a magnetic resonance phenomenon, including nuclide, atomic nucleus density, relaxation time, pulse repetition time, echo time, MR imaging part, and parameters determining image processing.

With a resonance imaging apparatus of this type, MR imaging is effected as follows. The MR imaging target part of the subject is set in a specified position within a gantry. After entering relevant particulars including patient registration, the operator selects an RF coil and a matrix according to diagnostic items and further selects MR imaging parameters including nuclide, atomic nucleus density, relaxation time, pulse repetition time, echo time, pulse shape, and pulse-sequence.

Furthermore, the operator also selects image processing parameters, restructuring parameters, and output parameters. After those parameters have been selected, the apparatus is ready to scan. When the scan button is operated, a predetermined pulse-sequence is repeated by means of a sequencer. The sequentially collected data items are stored in a memory in the computer system. Therefore, these data items are sent to the restructuring unit in the computer system, which restructures them to form image data. The operator then selects one of image display, imager output, and image storage as the occasion demands, and at the time of diagnosis, reads images on the display or films.

In the above-mentioned MR imaging procedure, the operator sets parameters so that images suitable for diagnosis complying with the expected diagnostic items may be obtained. However, when the obtained image is unsatisfactory or when the doctor wants to diagnose from another viewpoint, another picture needs to be MR imaged by repeating the aforementioned MR imaging procedure. For instance, the doctor may judge that an axial picture obtained by MR imaging a certain portion of the head would not provide good diagnostic information, and therefore may desire another MR image of the portion to form a sagittal picture.

As described above, with such a conventional apparatus, the MR imaging procedure must be repeated until the desired image is obtained. In this case, when what is diagnosed is a still object, there is no problem with images obtained at long intervals. However, when what is diagnosed is a moving object, images obtained at long intervals prevent pathologic analysis from being performed satisfactorily. For instance, when the movement of a knee or a joint needs to be diagnosed dynamically, or when the flow from when a contrast medium is injected until it is excreted needs to be diagnosed dynamically, various types of images can be obtained. However, because the MR imaging procedure must be repeated every time each image is formed, it takes a long time to produce each image. This prevents a dynamic diagnosis from being made actually, which becomes a problem.

Such a problem stems from the fact that once the conventional apparatus has set parameters, it cannot effect MR imaging using different parameters unless the MR imaging procedure based on the present parameters has been finished.

SUMMARY OF THE INVENTION

The object of the present invention is to provide a magnetic resonance imaging apparatus suitable for a dynamic diagnosis of the subject involving body movement and the flow of a contrast medium.

The foregoing object is accomplished by providing a magnetic resonance imaging apparatus comprising: collecting means for collecting magnetic resonance signals from a subject; restructuring means for restructuring the magnetic resonance signals collected by the collecting means; image processing means for processing the images restructured at the restructuring means; output means for outputting the images processed at the image processing means; and linkage control means for controlling the linkage of the operation of the collecting means with the operation of the restructuring means, the image processing means, and the output means.

The foregoing object is also accomplished by providing a magnetic resonance imaging apparatus comprising: collecting means for collecting from a subject the magnetic resonance signals corresponding to N phase encode data items for restructuring each of a plurality of images; restructuring means for restructuring each set of N phase encode data items corresponding to the magnetic resonance signals obtained by the collecting means; image processing means for processing the restructured images obtained at the restructuring means; image output means for outputting the processed images obtained at the image processing means; and changing means for changing the number of phase encode data items updated among the N phase encode data items restructured at the restructuring means, while the collecting means is in operation.

With the present invention, image groups to be displayed can be generated sequentially in the course of time-consuming data acquisition, thereby enabling them to be displayed in semi-real time. This feature enables a dynamic diagnosis of the subject involving body movement and the flow of a contrast medium, for example.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a detailed block diagram of the computer system of FIG. 1;

FIG. 7 is a view of a screen display pattern in the operation of the embodiment;

DETAILED DESCRIPTION OF THE PREFERRED EMBODIMENTS

Figure 1:
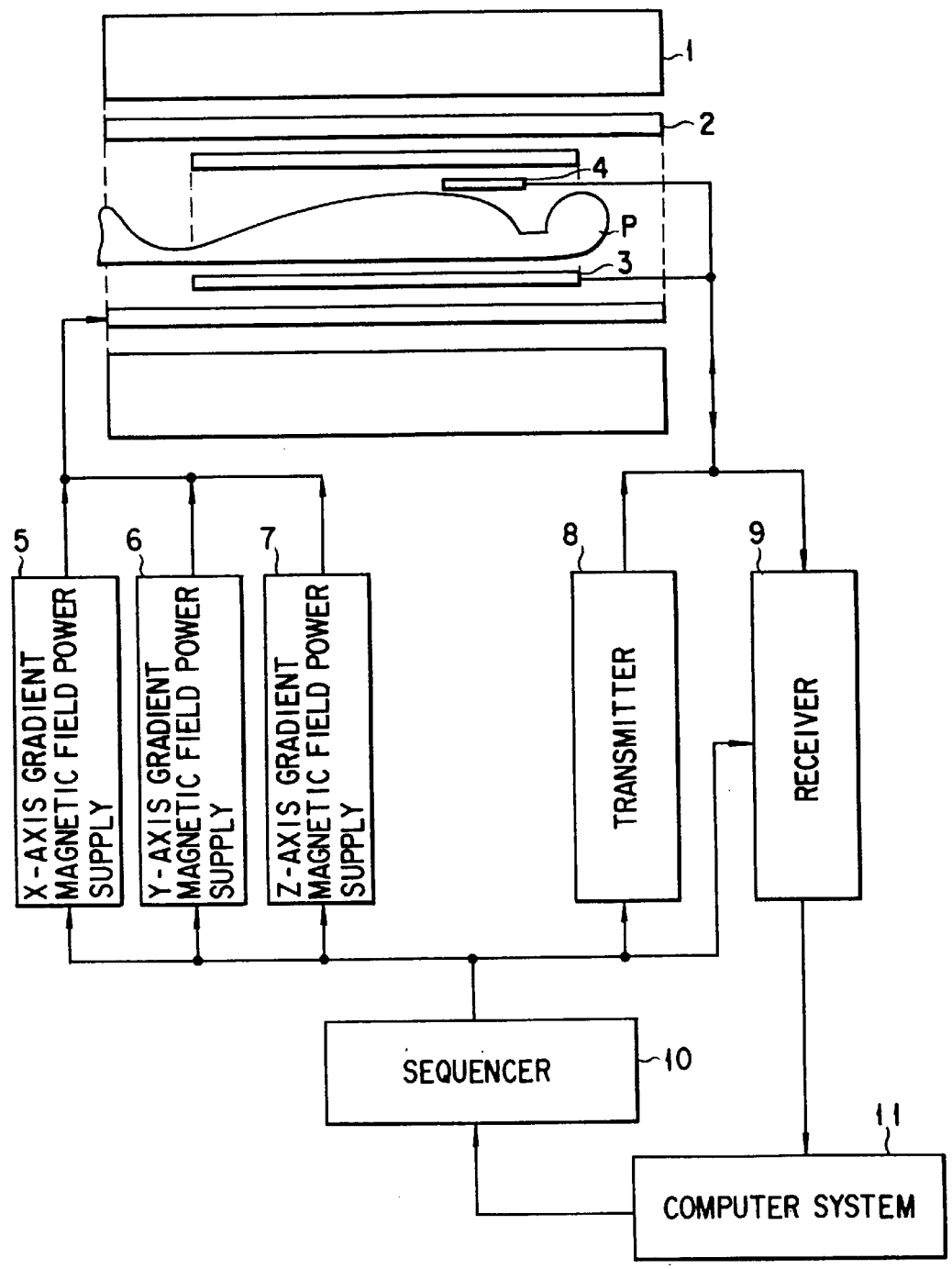
FIG. 1 is a block diagram of an embodiment of a magnetic resonance imaging apparatus according to the present invention.

Hereinafter, referring to the accompanying drawings, an embodiment of the present invention will be explained. In FIG. 1, a magnetic resonance imaging apparatus according to the present invention comprises: a static magnetic field magnet 1 designed to accommodate the subject P in it; X-, Y-, and Z-axis gradient magnetic field coils 2 for generating gradient magnetic fields to provide positional information on the part inducing magnetic resonance signals; a whole body coil 3 for transmitting high-frequency magnetic fields (RF pulses) and sensing the induced magnetic resonance signals (MR signals such as echo signals or FID signals); and a local coil 4 used as necessary.

The magnetic resonance imaging apparatus of the embodiment further comprises: X-, Y-, Z-axis gradient magnetic field power supplies 5, 6, 7 that control the excitation of the X-, Y-, and Z-axis gradient magnetic coils 2 respectively; a transmitter 8 that provides transmission control of RF pulses; a receiver 9 that provides reception control of induced MR signals; a sequencer that provides a pulse-sequence for data acquisition; and a computer system 11 that controls these units, processes the sensed signals, and displays the processed signals.

Figure 3:
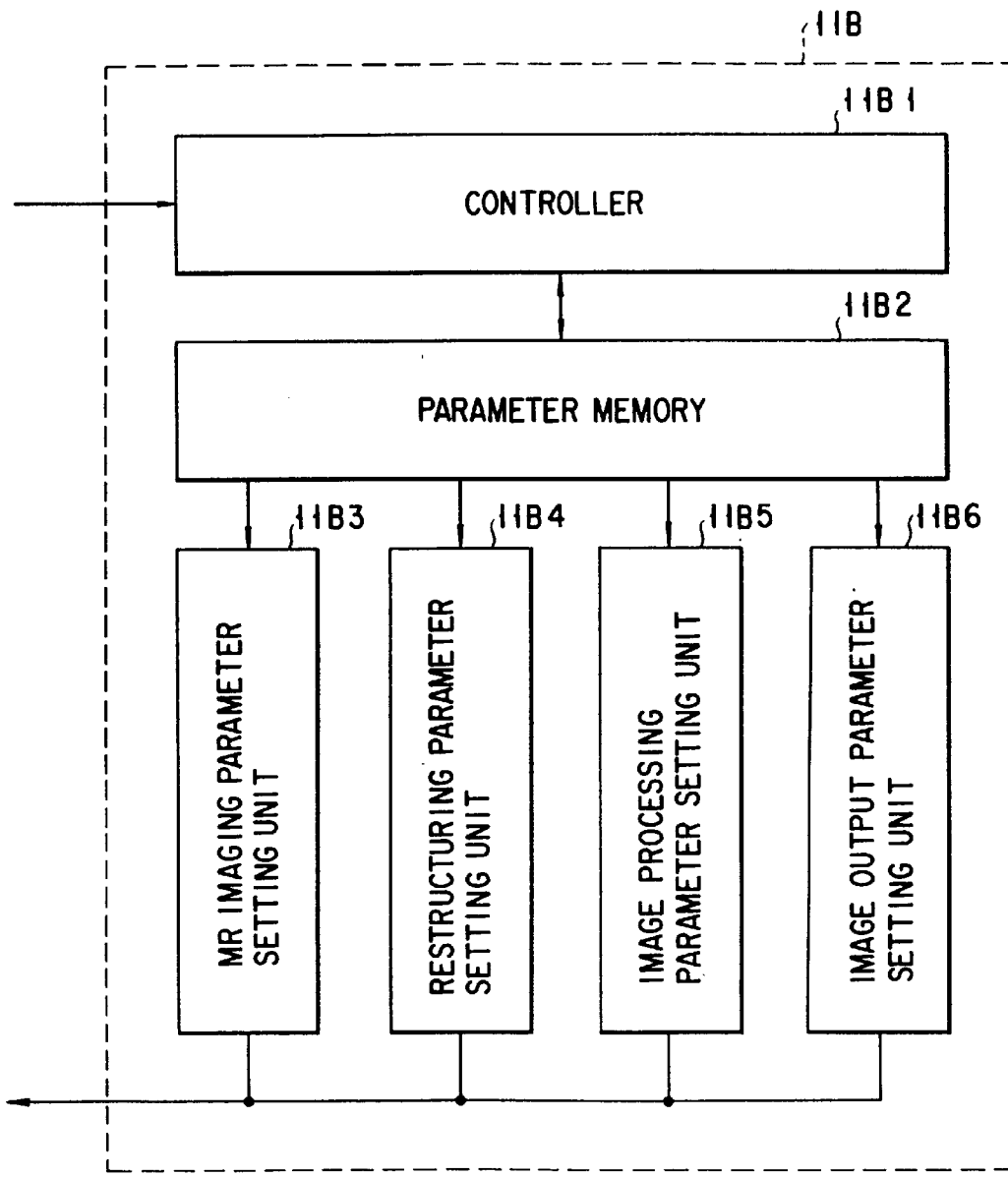
FIG. 3 is a detailed block diagram of the control section of FIG. 1.

The computer system 11 is shown in detail in FIGS. 2 and 3. As shown in FIGS. 2 and 3, the computer system 11 comprises: a bus line 11A that supervises the exchanging of data (including control data and MR data) between the sequencer 10 and the receiver 9; a control section 11B that executes various controls, including the control of the entire system; an operator section 11C containing a console 11C1 and a mouse 11C2 that supervises man-machine interface; an image processing section 11D containing a restructuring unit 11D1 for restructuring MR data by, e.g., a Fourier transformation method, to create image data and an image processor 11D2 for effecting image processing such as enlargement; and an image output section 11E containing a memory 11E1 such as a disk storage unit for storing image data, an imager 11E2, and a display 11E3.

The control section 11B is characterized by comprising a controller 11B1, a parameter memory 11B2, an MR imaging parameter setting unit 11B3, a restructuring parameter setting unit 11B4, an image processing parameter setting unit 11B5, and an image output parameter setting unit 11B6. The process of changing parameters, which is a characteristic of the embodiment, is executed by the control section 11B and the operator section 11C.

The MR imaging parameter setting unit 11B3 sets magnetic resonance imaging parameters which determine at least one of RF coil, the number of matrixes, nuclide, pulse repetition interval, echo time, the shape of RF pulse, a pulse-sequence, a flip angle of RF pulse, the application direction of read-out gradient magnetic field, imaging area, slice thickness, imaging plane.

The restructuring parameter setting unit 11B4 sets restructuring parameters which determine at least one 1) of the number of phase encodes for restructuring images, 2) the number of phase encode data items updated among the phase encode data items necessary for restructuring a single image, and the number of averaging operations on phase encode data items.

The image processing parameter setting unit 11B5 sets image processing parameters which determine one of image processes including enlargement and reduction.

The image output parameter setting unit 11B6 sets output parameters which determine at least one of display representation, imager representation, and image storage.

After the fluoroscopy mode is selected at the operator section 11C, the controller 11B1 writes in the parameter memory 11B2 the parameter data transferred. This enables the parameter data updated at the parameter memory 11B2 to be sent to the MR imaging parameter setting unit 11B3, the restructuring parameter setting unit 11B4, the image processing parameter setting unit 11B5, and the image output parameter setting unit 11B6. Therefore, even when data acquisition is now going on, the image process and output can be performed under conditions conforming with the changed parameters different from the originally set parameters.

With the above configuration, the sequencer 10 executes the MR imaging sequence determined by the MR imaging parameters supplied via the MR imaging parameter setting unit 11B3 on the basis of the parameter data items stored in the parameter memory 11B2. Specifically, driving the transmitter 8 causes the RF coil 3 to apply RF pulses to the subject P, and a magnetic resonance signals are sensed from the subject P.

By driving the gradient magnetic field power supplies 5, 6, 7, the gradient magnetic field coils 2 apply gradient magnetic fields Gx, Gy, and Gz to the subject P as slice gradient magnetic field Gs, read-out gradient magnetic field Gr, and phase encode gradient magnetic field Ge, respectively. Thereafter, the MR signals from the expected area of the excited subject P are collected by the RF coil 3 or 4. The collected signals are supplied to the computer system 11 via the receiver 9, which restructures them to create image data, processes the image data if necessary, and displays the image data on the display 11E3.

The operation of the embodiment basically differs from that of a conventional magnetic resonance imaging apparatus, with which, the linkage of the data acquisition system with the image processing system and the image output system cannot be canceled as long as magnetic resonance signals are being collected, and the restructuring, image processing, and image output are effected only under conditions conforming with the originally set parameters.

Figure 4:
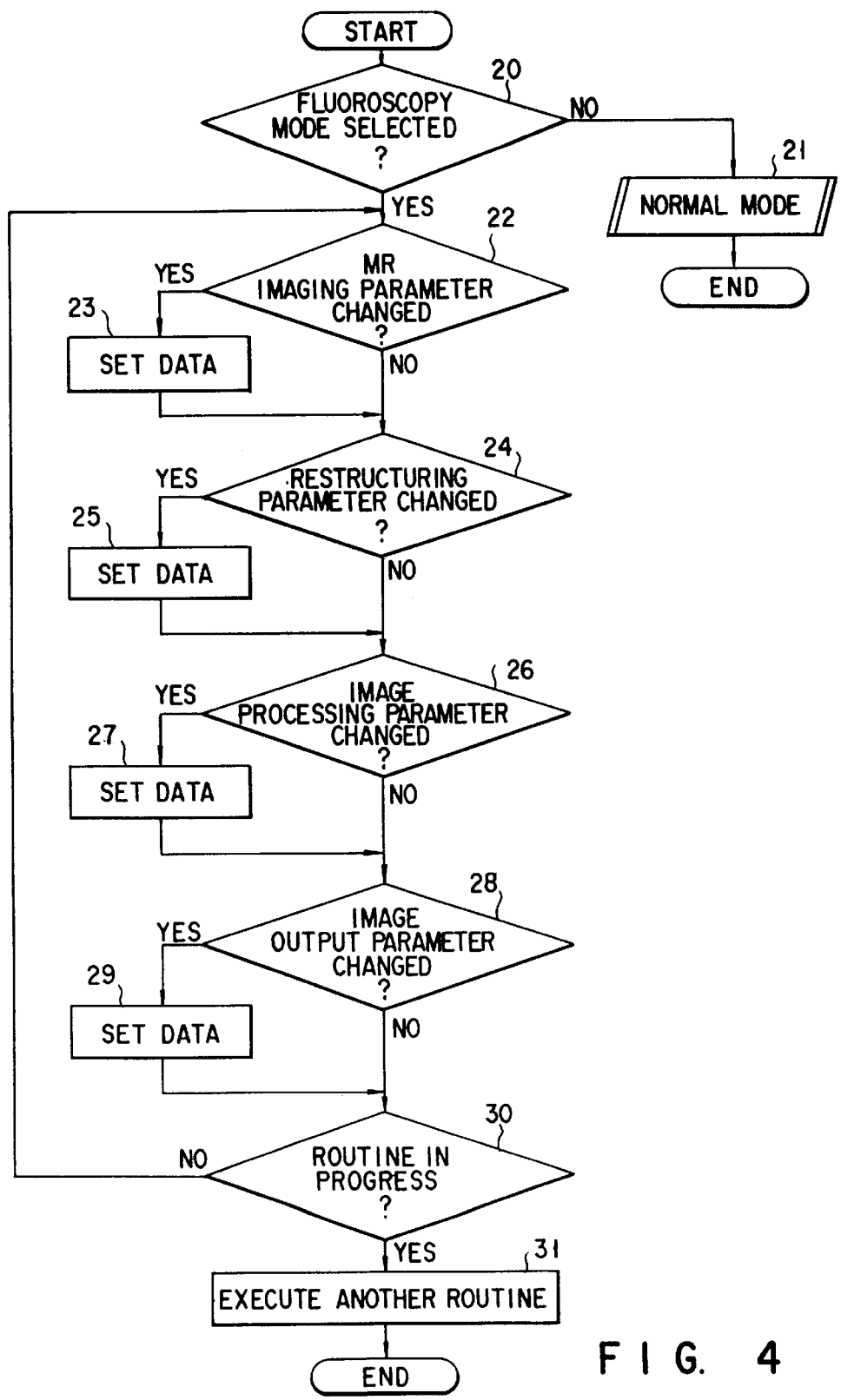
FIG. 4 is a flowchart for an example of the operation of the embodiment.

The flow of the operation characteristic of the embodiment will be described with reference to FIG. 4. After the apparatus is started up and the preparatory operation (not shown) is completed, a specific command (not shown) is entered from the operator section 11C. At this stage, the fluoroscopy mode is ready to interrupt the normal mode, and control proceeds to process 20. In this process 20, for example, display pattern 100A for the fluoroscopy mode process shown in FIG. 5 appears on the display 11E3.

The display pattern 100A is provided with button 100A1 for selecting parameters related to patient registration and MR imaging conditions, button 100A2 for selecting parameters related to an image display/process, which is a form of restructuring condition, image processing condition, and image output condition, button 100A3 for selecting parameters related to various conditions necessary for filming, which is a form of image output, button 100A4 for selecting parameters able to cancel a request waiting for imager output, which is a form of image output, and button 100A5 for terminating the fluoroscopy mode process. These buttons 100A1 to 100A5 are to be operated from the operator section 11C. The operation is usually effected by means of the mouse 11C2.

Figures 5, 6:
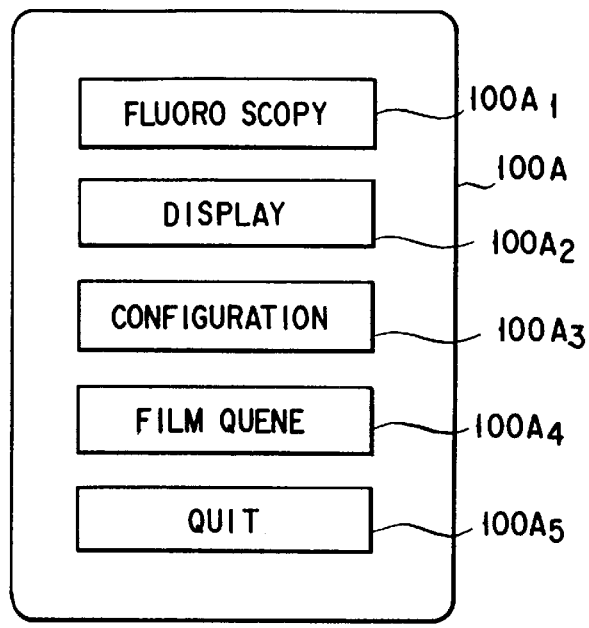
FIG. 5 is a view of a screen display pattern in the operation of the embodiment.
FIG. 6 is a view of a screen display pattern in the operation of the embodiment.

When in process 20, the display pattern 100A for the fluoroscopy mode process appears on display 11E3 and button 100A1 is selected with mouse 11C1, the display pattern 100B for selecting parameters related to patient registration shown in FIG. 6 and the display pattern 100C for selecting parameters related to MR imaging conditions shown in FIG. 7, together with screen modification, appear on display 11E3. If the fluoroscopy mode process is not selected in process 20, control will normally go to process 21, or return to the normal mode.

Once the display pattern 100B is displayed, various data items about the patient, including the patient's sex and age, and other data items, such as the type of RF coil used if necessary, or the number of matrixes can be entered. After the display pattern 100C is displayed, parameters determining MR imaging conditions can be changed.

The changing of various parameters is performed in processes 22 to 27. The parameter specified from a button is written as parameter data in the parameter memory 11B2 of the control section 11B. Thereafter, control goes to processes 28, 29, and then to the next routine where the conditions for restructuring, image processing, and image output are set. When the termination of the fluoroscopy mode process or the return of the normal mode are specified from button 100A5 for completing the fluoroscopy mode process while the operation is in progress, the fluoroscopy mode process will be terminated or control will return to the normal mode process.

The display pattern 100C will be explained in detail. The display pattern 100C is provided with button 100C1 for specifying the axial plane, the sagittal plane, and the coronal plane, button 100C2 for specifying the read-out direction in an MR imaging operation to reducing artifacts, button 100C3 for specifying the number of averaging operations in a superposition process, button 100C4 for dynamically specifying the MR imaging position across the subject, from front to back and side to side, button 100C5 for specifying image storage intervals, button 100C6 for specifying the suspension of the fluoroscopy mode process, button 100C7 for specifying the end of the fluoroscopy mode process, and display screen 100C8 for displaying the images obtained from the fluoroscopy mode process. These buttons 100C1 to 100C7 can be selected or specified from the mouse 11C1.

Figures 8A, 8B:
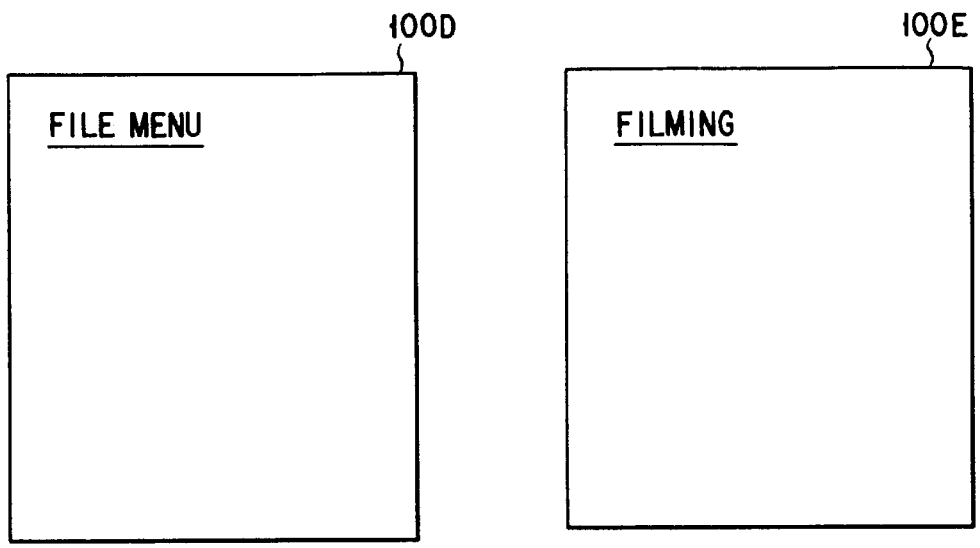
FIGS. 8A and 8B are views of screen display patterns in the operation of the embodiment.

Once the display pattern 100D shown in FIG. 8 has appeared, the display or the image processing of the obtained images or the stored image can be selected or specified. After the display pattern 100E shown in FIG. 8B has been displayed, various conditions for the filming process, a form of image output, can be selected or specified.

Figure 9:
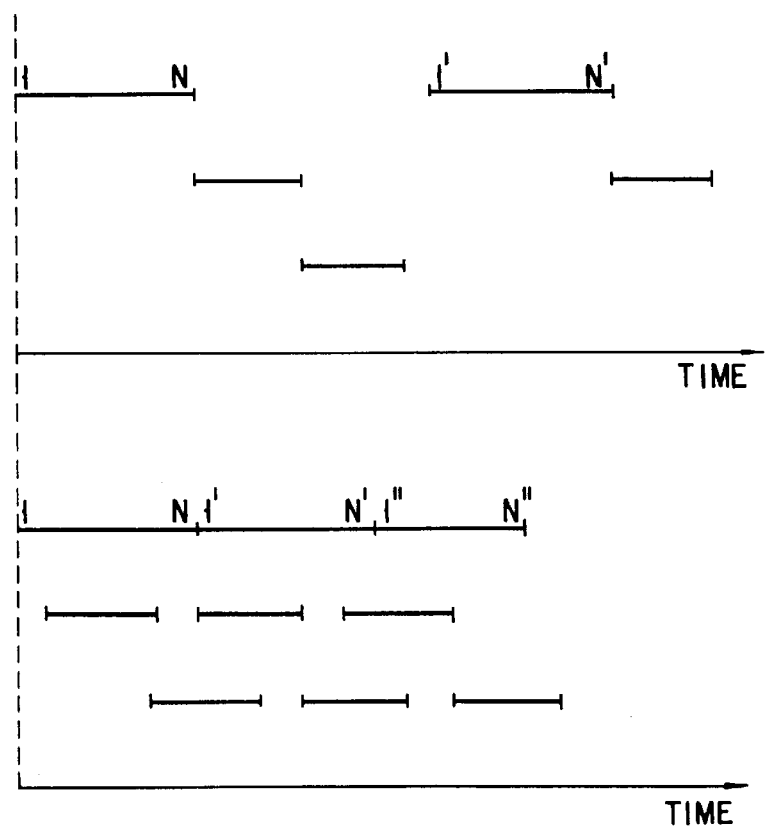
FIG. 9 is a timing diagram of the operation of the embodiment.

The fluoroscopy mode process realized in the invention will be described with reference to FIG. 9, in comparison with the normal mode process. As shown at the top of FIG. 9, in the normal mode process, since the MR imaging operation is linked with the restructuring operation, image processing operation, and display operation, control can proceed to neither the restructuring operation nor the image processing operation nor the display operation unless the MR imaging operation is completed. When a single image requires N MR data items (when the number of encodes is N), to obtain a first image, the data group is restructured to create image data at the time when a first data item to an N-th data item have been collected. Thereafter, image display is carried out immediately. Then, the process of obtaining a second image is started. If the data acquisition operation is linked with the restructuring process, image processing process, and image output, a dynamic diagnosis of the subject involving body movement and the flow of a contrast medium cannot be made.

In contrast, as shown at the bottom of FIG. 9, in the fluoroscopy mode process, because the linkage of the MR imaging operation with the restructuring operation, image processing operation, and display operation is canceled, not only MR imaging conditions but also restructuring conditions, image processing conditions, and image display conditions can be reset as required, even when the MR imaging operation is in progress. Similarly, to obtain a second image, part of the first to N-th data items obtained in the preceding data acquisition can be used as a group of data items to form the second image, before a first data item to an N-th data item have been collected for the current formation. Therefore, restructuring, image processing, and image display can be effected with respect to a time axis different from the time axis of data acquisition, and thereby suitably selecting parameters enables a dynamic diagnosis of the subject involving body movement and the flow of a contrast medium.

Figure 10:
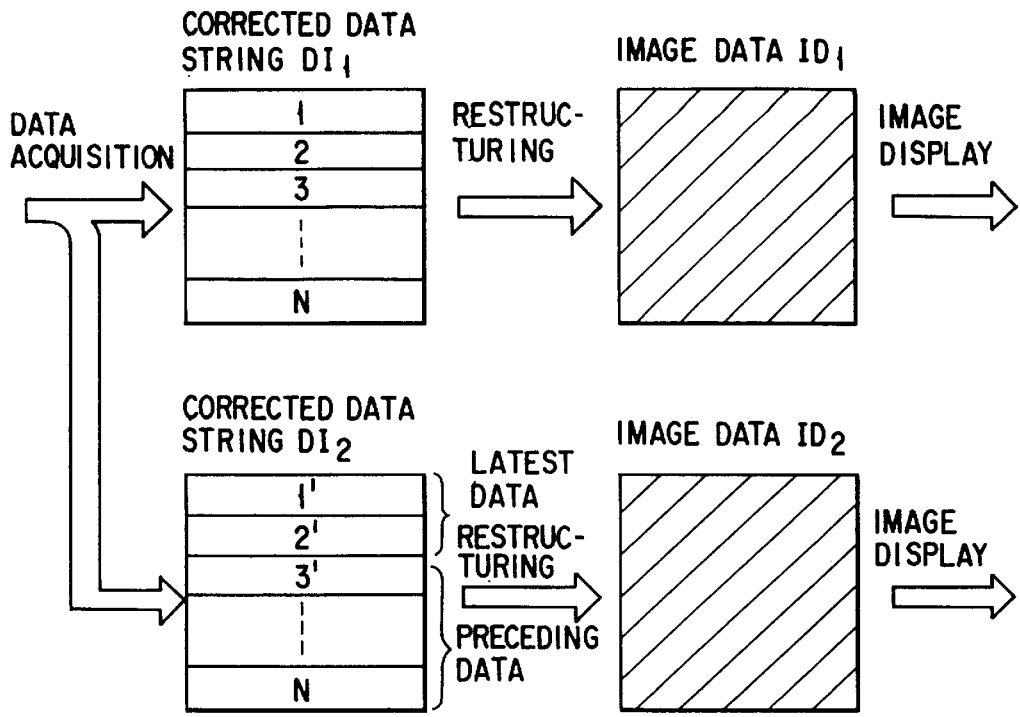
FIG. 10 is a pictorial view to help explain the operation of MR imaging, image processing, and image output in the embodiment.

Referring to FIG. 10, a means for synthesizing a data string for each image to be restructured sequentially will be explained. A first image data set ID1 is obtained by restructuring the previous data items DI1 (data item 1 to data item N), and is displayed. A second image data set ID2 is obtained by combining the following data items 1', 2', and the preceding data items 2 to N, and restructuring the combined data times. By synthesizing the data string to be restructured using part of the data items obtained in the preceding data acquisition, almost regardless of the data acquisition operation, the image to be displayed can be obtained at short intervals. This realizes fluoroscopic imaging that enables a dynamic diagnosis of the subject optimally.

Furthermore, pulse repetition interval TR can be changed in the course of data acquisition. For instance, by setting pulse repetition interval TR at a shorter value in the course of data acquisition, an image with emphasized longitudinal relaxation time T1 can be obtained.

Figure 11A:
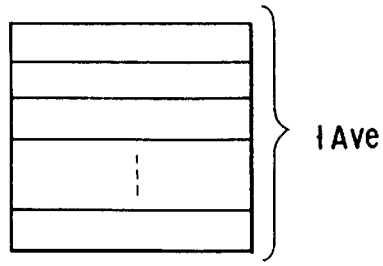
FIGS. 11A and 11B are diagrams to help explain the averaging process in the embodiment.
Figure 11B:
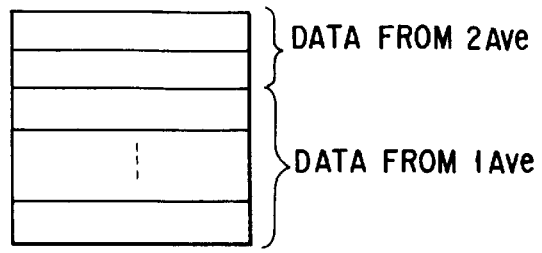

Referring to FIGS. 11A and 11B, an example of the averaging process will be explained. In the embodiment, even during an MR imaging operation, not only can an averaging process (1 Ave) be performed on part of a data string (FIG. 11A), but an averaging process can also be performed on a part and another part of a data string at different times (1 Ave, 2 Ave), respectively (FIG. 11B).

Next, referring to FIG. 12, an operation mode different from that in FIG. 9 will be described. The example in FIG. 9 is characterized in that the data acquisition is disconnected from the restructuring operation. After the data acquisition operation has been disconnected from the restructuring operation, N phase encode data items to be used for restructuring are obtained by updating only some data items (two in the case of FIG. 10) of the N phase encode data items used for restructuring, thereby achieving fluoroscopic imaging. In contrast, the example of FIG. 12 is characterized in that the number of phase encode data items updated of the N phase encode data items to be restructured is changed as required in the course of data acquisition.

Figure 12:
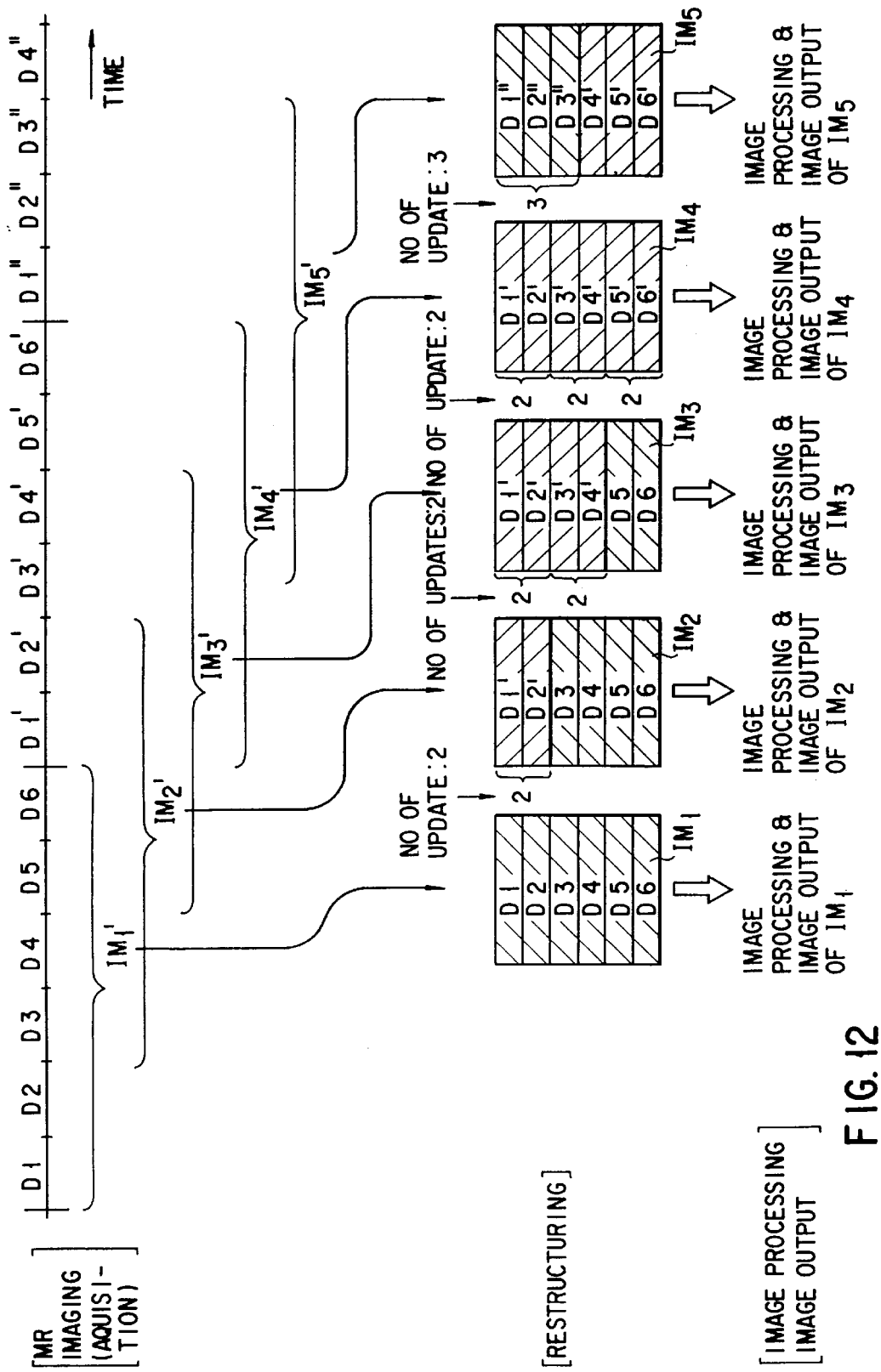
FIG. 12 is a timing diagram for another example of the operation of the embodiment.

In the example of FIG. 12, to simplify explanation, a case where a single image is restructured from six phase encode data items. Data acquisition is effected in an MR imaging operation in such a manner that D1 to D6, D1' to D6', D1" to D6" are collected consecutively. Then, image IM1 is restructured from data group IM1' consisting of D1 to D6. Next, only D1 and D2 of data group IM1' are updated into D1' and D2', and image IM2 is restructured from data group IM2'. In this case, the number of data times updated is two. Next, only D3 and D4 of data group are updated into D3' and D4', and image IM3 is restructured from data group IM3'. In this case, too, the number of data times updated is two. Then, only D5 and D6 of data group IM3' are updated into D5' and D6', and image IM4 is restructured from data group IM4'. In this case, too, the number of data items updated is two. Next, only D1', D2', and D3' of data group IM4' are updated into D1", D2", and D3", and image IM5 is restructured from data group IM5'. In this case, the number of data times updated is three. The images IM1 to IM5 restructured as described above are displayed continuously or discontinuously.

The example of FIG. 12 is the same as that of FIG. 9 in that fluoroscopic imaging is realized by canceling the linkage of the data acquisition operation with the restructuring operation, but is characterized in that the number of data items updated can be changed. This feature enables image groups whose rate of change differs between images to be obtained in spurious real time, thereby being more suitable for a dynamic diagnosis of the subject involving body movement and the flow of a contrast medium.

Furthermore, as in the example of FIG. 9, pulse repetition interval TR can be changed in the course of data acquisition. For instance, by setting the pulse repetition interval TR at a shorter value in the course of data acquisition, an image with emphasized longitudinal relaxation time T1 can be obtained.

In this case, by setting the pulse repetition interval TR at a shorter value in (or out of) the course of data acquisition, the number of data items updated can be increased in a condition that the restructuring time is a constant value.

On the other hand, by setting the pulse repetition interval TR at a longer value in (or out of) the course of data acquisition, the number of data items updated can be decreased in a condition that the restructuring time is a constant value.

While in the embodiment, fluoroscopic imaging has been realized, the present invention is not limited to this. For instance, a great variety of diagnostic forms can be realized by changing some or all of the MR imaging parameters determining MR imaging sequence, the parameters determining restructuring conditions, the image processing parameters determining image processing conditions, and the output parameters determining output conditions.

As described above, the present invention provides a magnetic resonance imaging apparatus best suitable for a dynamic diagnosis of the subject involving body movement and the flow of a contrast medium.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic resonance imaging apparatus comprising:

collecting means for collecting magnetic resonance signals from a subject, said collecting means include means for setting magnetic resonance imaging parameters that determine at least one of the number of matrixes, nuclide, pulse repetition interval echo time the shape of RF pulse, a pulse sequence, a flip angle of RF pulse, the application direction of a read-out gradient magnetic field, slice thickness, and imaging plane;

restructuring means for restructuring the magnetic resonance signals collected by said collecting means so as to image data, said restructuring means include means for setting restructuring parameters that determine at least one of the number of phase encodes for restructuring images, the number of phase encode data items updated among the phase encode data items required for restructuring a single image, and the number of averaging operation on phase encode data items;

image processing means for processing the magnetic resonance signals restructured at said restructuring means;

output means for outputting images based on the image data processed at said image processing means;

linkage control means for controlling the linkage of the operation of said collecting means with the operation of said restructuring means, said image processing means, and said output means;

console means for setting the magnetic resonance imaging parameters and the restructuring parameters in accordance with the manual operation; and control means for changing the magnetic resonance imaging parameters and the restructuring parameters different from the originally set parameters in accordance with the setting result of said console means while said collection means is in operation.

2. A magnetic resonance imaging apparatus according to claim 1, wherein said image processing means contains means for setting image processing parameters that include at least one of enlargement and reduction of the outputted images.

3. A magnetic resonance imaging apparatus according to claim 1, wherein said output means contains means for setting output parameters that determine at least one of display representation, imager representation, and image storage.

4. A magnetic resonance imaging apparatus according to claim 1, wherein said linkage control means contains means for setting ON-linkage control parameters for linking the operation of said collecting means with the operation of said restructuring means, said image processing means, and said output means with respect to time and executing the operations.

5. A magnetic resonance imaging apparatus according to claim 1, wherein said linkage control means contains means for setting OFF-linkage control parameters for canceling the linkage, with respect to time, of the operation of said collecting means with the operation of said restructuring means, said image processing means, and said output means and executing the operations.

6. A magnetic resonance imaging apparatus according to claim 1, wherein said control means changes the number of averaging operations on phase encode data items in said image processing means during the operation of said collecting means, said restructuring means, and said output means.

7. A magnetic resonance imaging apparatus according to claim 1, wherein said control means changes the number of phase encodes for restructuring images means during the operation of said collecting means, said restructuring means, and said output means.

8. A magnetic resonance imaging apparatus according to claim 1, wherein said control means changes the number of phase encode data items updated among the phase encode data items required for restructuring a single image during the operation of said collecting means, said restructuring means, and said output means.

9. A magnetic resonance imaging apparatus comprising:

collecting means for collecting from a subject the magnetic resonance signals corresponding to a plurality of sets of N phase encode data items for restructuring each of a plurality of images;

restructuring means for restructuring each set of N phase encode data items corresponding to the magnetic resonance signals obtained by said collecting means, image processing means for processing the phase encode data restructured at said restructuring means;

image output means for outputting an image based upon a first set of said N phase encode data processed by said image processing means, and for repeatedly updating said image using a predetermined number of said N phase encode data items from sets of encode data items subsequent to said first set; and changing means for changing the predetermined number of phase encode data items used to update said image while said collecting means is in operation.

10. A magnetic resonance imaging apparatus according to claim 9, wherein said changing means contains means for changing the pulse repetition interval in said collecting means during the operation of said restructuring means and said output means.

11. A magnetic resonance imaging apparatus according to claim 9, wherein said changing means contains means for changing the pulse repetition interval and the predetermined number of phase encode data items used to update said image during the operation of said restructuring means and said output means.

12. A magnetic resonance imaging apparatus according to claim 9, wherein said changing means contains means for changing the number of averaging operations on phase encode data items in said image processing means during the operation of said collecting means, said restructuring means, and said output means.

13. A magnetic resonance imaging apparatus according to claim 9, wherein said collecting means contains means for setting magnetic resonance imaging parameters that determine at least one of RF coil, the number of matrixes, nuclide, pulse repetition interval, echo time, the shape of RF pulse, a pulse-sequence, a flip angle of RF pulse, the application direction of a read-out gradient magnetic field, slice thickness, and imaging plane.

14. A magnetic resonance imaging apparatus according to claim 9, wherein said restructuring means contains means for setting restructuring parameters that determine at least one of the number of phase encodes for restructuring images, the number of phase encode data items updated among the phase encode data items required for restructuring a single image, and the number of averaging operations on phase encode data items.

15. A magnetic resonance imaging apparatus according to claim 9, wherein said image processing means contains means for setting image processing parameters.

16. A magnetic resonance imaging apparatus according to claim 9, wherein said output means contains means for setting output parameters that determine at least one of display representation, imager representation, and image storage.

17. A magnetic resonance imaging apparatus according to claim 9, wherein said control means changes the number of phase encodes for restructuring images during the operation of said collecting means, said restructuring means, and said output means.

18. A magnetic resonance imaging apparatus according to claim 9, wherein said control means changes the number of phase encode data items updated among the phase encode data items required for restructuring a single image during the operation of said collecting means, said restructuring means, and said output means.

19. A magnetic resonance imaging apparatus comprising:

collecting means for collecting magnetic resonance signals from a subject;

restructuring means for restructuring the magnetic resonance signals collected by said collecting means to image data;

image processing means for processing the magnetic resonance signals restructured at said restructuring means;

output means for outputting images based on the image data processed at said image processing means;

linkage control means for controlling the linkage of the operation of said collecting means with the operation of said restructuring means, said image processing means, and said output means;

console means for setting the magnetic resonance imaging parameters and the restructuring parameters in accordance with manual operation; and control means for changing the magnetic resonance imaging parameters and the restructuring parameters different from the originally set parameters in accordance with the setting result of said console means while said collection means is in operation;

wherein said control means changes the number of averaging operations on phase encode data items in said image processing means during the operation of said collecting means, said restructuring means, and said output means.

* * * * *

UNITED STATES PATENT AND TRADEMARK OFFICE
CERTIFICATE OF CORRECTION

PATENT NO. : 5,898,305
DATED : April 27, 1999
INVENTOR(S) : K. Kobubun et al.

It is certified that error appears in the above-indentified patent and that said Letters Patent is hereby corrected as shown below:

Face of Patent [72] Apr. 18, 1997 should read --Apr. 17, 1997--.

Signed and Sealed this

Second Day of November, 1999

Attest:

Q. TODD DICKINSON

Attesting Officer

Acting Commissioner of Patents and Trademarks